United States Patent [19]
Pugel

[11] Patent Number: 5,619,283
[45] Date of Patent: Apr. 8, 1997

[54] DOUBLE TUNED RF CIRCUIT WITH BALANCED SECONDARY

[75] Inventor: Michael A. Pugel, Nobelsville, Ind.

[73] Assignee: Thomson Consumer Electronics, Inc., Indianapolis, Ind.

[21] Appl. No.: 287,003

[22] Filed: Aug. 8, 1994

[51] Int. Cl.$^6$ ........................................ H04N 5/50
[52] U.S. Cl. ................ 348/731; 455/191.2; 333/25; 334/15
[58] Field of Search .................. 348/731–733; 455/191.1, 191.2, 193.2, 193.3, 338, 318, 326, 180.4; 333/25; 334/15; H04N 5/50

[56] References Cited

U.S. PATENT DOCUMENTS

| | | | |
|---|---|---|---|
| 3,962,643 | 6/1976 | Ma | 325/464 |
| 4,646,360 | 2/1987 | Muterspaugh | 455/191.1 |
| 4,675,634 | 6/1987 | Matsushita et al. | 334/15 |
| 4,749,974 | 6/1988 | Yamamoto et al. | 334/15 |
| 4,905,306 | 2/1990 | Anderson | 455/191.1 |
| 4,996,599 | 2/1991 | Anderson | 348/733 |
| 5,077,543 | 12/1991 | Carlie | 333/25 |
| 5,285,179 | 2/1994 | Wignof et al. | 455/191.2 |

OTHER PUBLICATIONS

Grundig Technische Informationen, vol. 29, No. 3, 1982, pp. 146–151, Lammermann & Rehak; "Pal–Secam–Tuner–ZF–Kobination Fur Das Cuc–Farbfernsehgerate–Chassis" (with translation) (copy of search report).

Elektor Electronics, vol. 14, No. 152, Jan. 1988 p. 69, "Front–end for FM–receiver".

Primary Examiner—Glenton B. Burgess
Attorney, Agent, or Firm—Joseph S. Tripoli; Peter M. Emanuel; Frederick A. Wein

[57] ABSTRACT

A band switchable double tuned circuit having a balanced secondary is presented. A primary tunable tank circuit with a plurality of first inductances is tuned to a first frequency by a first capacitor coupled in parallel with the first inductances. A secondary tank circuit with a plurality of second inductances inductively coupled to ones of the first inductances has a second capacitor coupled in parallel with the second inductances for tuning the secondary to the first frequency. The DC reference potential for the secondary circuit, is coupled to a nodal junction of the plurality of second inductances with the secondary tank circuit providing a balanced signal output. At least one of the plurality of first inductances and the second inductances are switchable for bandswitching the tuning of the primary and secondary tank circuits to a second frequency. The output signal from the balanced secondary is coupled to the input of a balanced mixer via constant bandwidth inductances without a mixer input balance transformer.

4 Claims, 3 Drawing Sheets

DOUBLE TUNED RF CIRCUIT WITH BALANCED SECONDARY

FIELD OF THE INVENTION

The present invention relates to television tuners, and more particularly to double tuned circuits for converting a single ended RF signal to a balanced RF signal.

BACKGROUND

Frequency selective tuned circuits are often used before and after RF amplifying stages of a television tuner. Current practice involves the use of a double tuned filter in the signal path before a mixer to further improve frequency selection and to provide better image rejection.

It is desirable to drive the mixer in an optimum manner in order to maximize conversion efficiency, and reduce unwanted harmonics and image frequencies. The mixer of the present embodiment is a Gilbert cell mixer wherein the input circuit is arranged in a common base configuration. Such an arrangement provides a very consistent low input impedance with optimum gain, wide bandwidth, good stability and low noise when the signal input is driven from a balanced source.

To this end, it is desirable to drive the mixer from a balanced source and to maintain this balanced drive when bandswitching between frequency bands.

SUMMARY

Briefly, the present invention concerns a double tuned circuit having a balanced secondary. A primary tunable tank circuit with at least a first inductance is tuned to a predetermined frequency by a first capacitor. A secondary tank circuit with a plurality of series connected second inductances is tuned to the predetermined frequency by a second capacitor. A DC reference potential for the circuit is coupled to a nodal junction of the plurality of second inductances with the secondary tank circuit providing a balanced signal output.

BRIEF DESCRIPTION OF THE DRAWINGS

Reference can be had to the following drawings wherein like members have been assigned like designations, and wherein.

DETAILED DISCLOSURE OF THE PREFERRED EMBODIMENT

Figure 1:
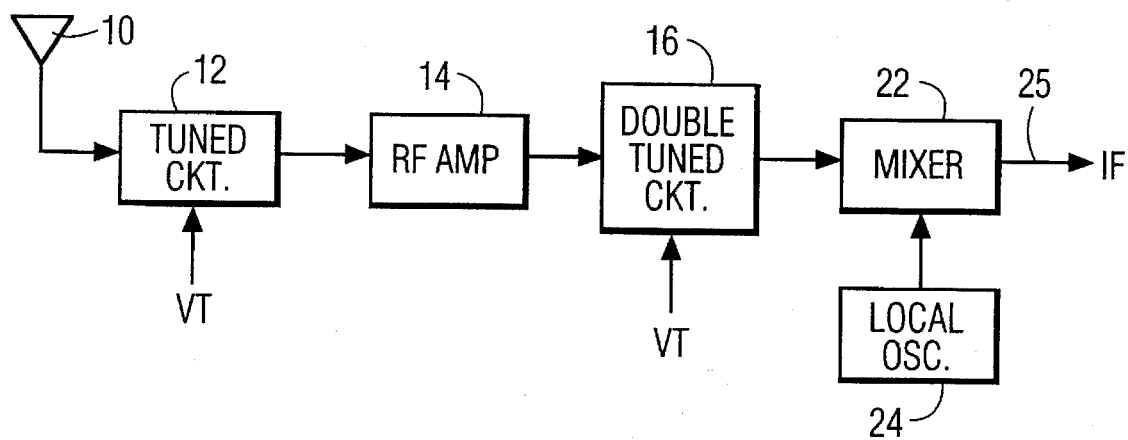
FIG. 1 is a block diagram of a portion of a typical tuner of a television apparatus.

FIG. 1 shows a typical arrangement of a television tuner. The RF signal path typically includes, in the order named, an antenna 10 or other television signal source, a tuned circuit 12, an RF amplifier 14, and a tuned circuit 16 which desirably is double tuned in order to provide sufficient adjacent channel signal rejection. The output signal from tuned circuit 16 is coupled to a mixer 22 where it is mixed with a signal from local oscillator 24 for converting the RF signal to an IF signal 25. Tuned circuit 12, double tuned circuit 16, and local oscillator 24 are tuned by a tuning voltage (VT) to a selected channel or frequency. Tuning voltage (VT) typically is applied to varactor diodes. Bandswitching often is also provided for tuned circuit 12, double tuned circuit 16, and local oscillator 24, i.e., bandswitching between the VHF low frequency band of channels 2–6 (United States) and the VHF high frequency band of channels 7–13 (United States).

Figure 2:
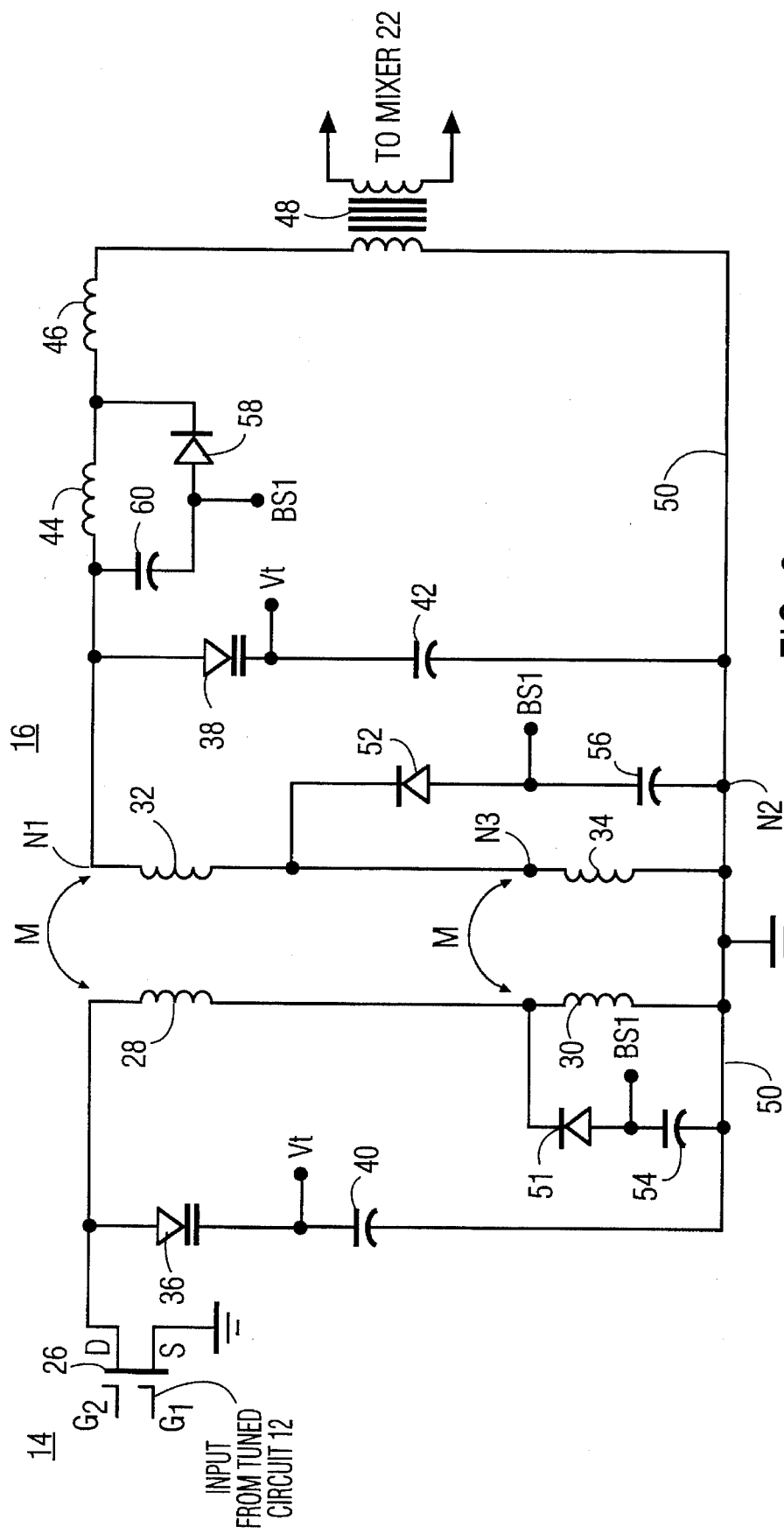
FIG. 2 is a schematic diagram of the double tuned circuit of FIG. 1 according to the prior art.

Referring now to FIG. 2, there is shown a schematic diagram of a typical prior art arrangement for the double tuned circuit 16. Circuit 16 receives a signal from single ended RF amplifier 14, and couples the double tuned signal to the balanced input of a mixer 22. RF amplifier 14 typically is a MOSFET transistor 26 wherein the signal from tuned circuit 12 is coupled to gate electrode G1 with an RF AGC signal (not shown) being coupled to gate electrode G2. The source electrode S of transistor 26 is grounded and an amplified signal is available at the drain electrode D.

In the lower frequency band, the signal from drain electrode D is applied to a double tuned circuit 16 comprised of:

1) a primary circuit of series connected inductances 28, 30 coupled between drain electrode D to an AC reference point and DC reference potential 50, and 2) a secondary circuit of series connected inductances 32, 34 coupled between a nodal point N1, and AC reference point and DC reference potential 50.

There is a coefficient-of mutual inductance "M" between inductances 28, 32 and between inductances 30, 34. The primary circuit is tuned to the desired frequency by varactor diode 36 coupled across inductances 28, 30 and the secondary circuit is tuned to about the same frequency by varactor diode 38 coupled across inductances 32, 34. The capacitance of varactor diodes 36, 38 is changed by application voltage Vt applied to their respective cathodes which are coupled to signal ground through respective capacitors 40, 42.

The double tuned single ended output signal from secondary node N1 is coupled to mixer 22 through series connected inductors 44, 46 and balun transformer 48. The values of inductors 44, 46 are chosen to provide a constant bandwidth with frequency over the appropriate frequency band, as disclosed in U.S. Pat. No. 3,628,152 of Carlson. One side of the primary of balun transformer 48 is coupled to reference point 50 with the secondary winding providing a balanced signal to the input terminals of mixer 22, which can be a single or doubly balanced mixer.

Bandswitching is accomplished by PIN diodes 51, 52 coupled across respective inductances 30, 34. Diodes 51, 52 are switched by bandswitching control voltage BS1 applied to their respective anodes, which are signal grounded by respective capacitors 54, 56. In the switched "on" conductive state, diodes 51, 52 signal bypass respective inductances 30, 34, thus lowering the total inductance in the respective primary and secondary circuits, and raising the tuned frequency.

When bandswitching, the inductive value of constant bandwidth inductances 44, 46 is accordingly changed by the series connection of PIN diode 58 and capacitor 60 coupled across inductance 44, said diode 58 also being switched by bandswitching voltage BS1.

It should be noted that the tuning varactor diodes 36, 38 require a DC return path back to the DC reference potential 50 for their respective tuning voltage Vt and this DC return path is provided by their respective tuned inductances 28, 30 and 32, 34. In a similar manner bandswitching diodes 51, 52, and 58 require a DC return path for their respective bandswitching voltage BS1, with the return path for diode 51 being inductance 30, inductance 34 being the return path for diode 52, and inductances 44, 32, 34 being the return path for diode 58. An alternate DC return path for diode 58 is inductance 46 and the primary of balun transformer 48.

A balun transformer, for providing a balanced drive to the mixer, is a relatively expensive component and the transformer can be ill behaved making performance optimization difficult across the wide tuning band. A better performance across the tuning band and more consistent performance from unit to unit can be provided by avoiding use of transformer 48 and direct driving mixer 22. This is particularly desirable since the mixer of the present embodiment is a doubly balanced Gilbert cell mixer, i.e., an MTI 3001T integrated circuit manufactured by the Philips Company of the Netherlands. This mixer is driven in a grounded base configuration at about a 50 ohm impedance across a wide band of frequencies. However, with the elimination of transformer 48, conversion from an unbalanced configuration to a balanced configuration is now provided by double tuned circuit 16.

Figure 3:
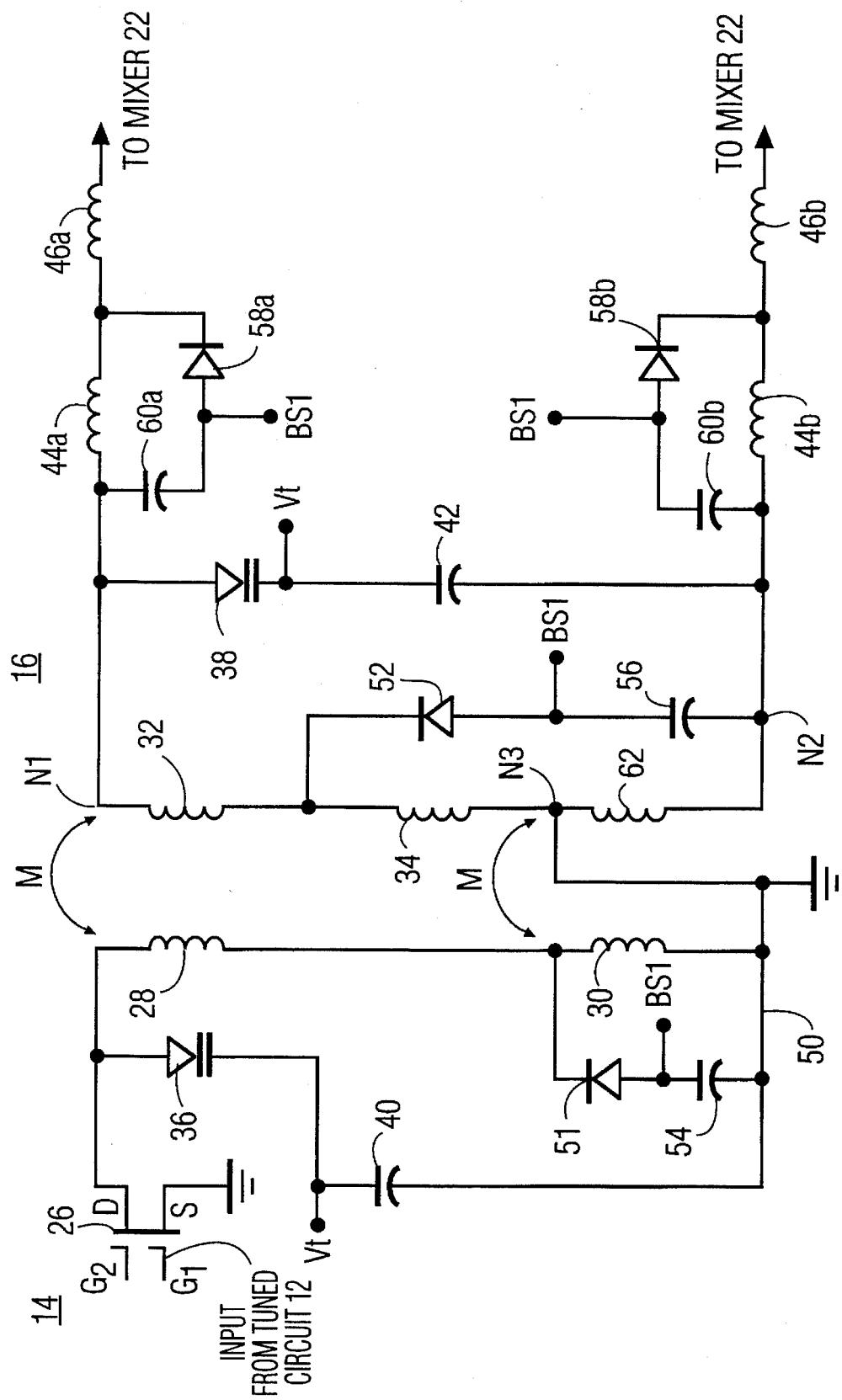
FIG. 3 is a schematic diagram of a double tuned circuit of an RF tuner according to aspects of the present invention.

Reference is now made to FIG. 3 wherein like members shown in FIG. 2 have given like numeral designations. In the lower frequency band, the signal from drain electrode D is applied to double tuned circuit 16 comprised of:

1) a primary circuit of series inductances 28, 30 coupled between drain electrode D to AC reference point and DC reference potential 50, and 2) a secondary circuit of inductances 32, 34 and 62 coupled between nodal points N1 and N2.

There is a coefficient of mutual inductance "M" between inductances 28, 32, and between inductance 30 and at least one of the secondary inductances 34 and 62. The inductance values of inductances 32 and 34 are the same as in the circuit arrangement shown in FIG. 2. However, the inductance value of inductance 62 is equal to the sum of the inductance values of series connected inductances 32 and 34. The primary circuit is tuned to the desired frequency by varactor diode 36 coupled across series connected inductances 28, 30 and the secondary circuit is tuned to about the same frequency by varactor diode 38 coupled across series connected secondary inductances 32, 34 and 62. In this arrangement, a double tuned balanced signal is provided between nodal points N1 and N2.

The DC reference potential 50 is coupled to a nodal point N3, which is the junction of secondary inductances 34 and 62. Since the inductance of inductance 62 equals the sum of the inductance of inductances 32 and 34, connection of reference potential 50 is at the AC reference point for the balanced system and the AC grounding of node N3 does not change the AC signal characteristics of the secondary of double tuned circuit 16.

The tuning of double tuned circuit 16 is accomplished by changing the capacitance of varactor diodes 36, 38 by application of tuning voltage Vt applied to their respective cathodes, which are AC coupled across their respective primary and secondary inductances by respective capacitors 40, 42. The balanced double tuned output signal from nodes N1, N2 is coupled to mixer 22 through respective series connected constant bandwidth inductors 44a, 46a, and 44b and 46b. The sum of the inductance value of series inductances 44a, 46a and 44b, 46b are chosen for providing a signal of constant bandwidth with frequency, over the appropriate frequency band, to mixer 22. Such a constant bandwith arrangement is disclosed in U.S. Pat. No. 3,628,152 of Carlson, which is incorporated by reference herein.

Bandswitching is accomplished by PIN diodes 51 and 52 coupled across respective inductances 30, and 34, 62. Switching diodes 51, 52 are switched by bandswitching voltage BS1 applied to their respective anodes, with the AC circuit being completed by respective capacitors 54, 56. In the switched "on" conductive state, diodes 51, 52 signal bypass respective inductance 30, connecting inductances 34 and 62 in parallel with each other, thus lowering the total inductance in the respective primary and secondary circuits, and raising the tuned frequency.

Since the signal from nodes N1, N2 is a balanced signal, changes made in one signal path must also be made in the other signal path in order that the signal remain balanced. The values of the sum of inductances 44a, 46a, and of 44b, 46b are accordingly changed by the switching "on" of respective PIN diodes 58a, 58b by bandswitching voltage BS1. Respective capacitances 60a, 60b complete the diode circuit.

Tuning varactor diodes 36, 38 require a DC return path for tuning voltage Vt, and bandswitching diodes 51, 52, 58a and 58b require a DC return path for their respective bandswitching voltage BS1. This will now be discussed.

In the bandswitched mode, the balanced signal at node N2 is isolated from DC ground return 50 by inductances 34 and 62, which are in an AC parallel arrangement. This prevents the signal at node N2 from being short circuited to ground while still providing a DC return path for the diodes 38, 52, 58a and 58b. This AC isolation of DC ground return 50 by the parallel connection of inductances 34 and 62 is effective even though inductance 30 of the primary circuit is signal short circuited by bandswitching diode 51. This is because the coefficient of mutual inductance "M" between inductances 30 and inductances 34, 62 goes to zero since there is no signal current flowing through inductance 30. Thus, an AC short circuit of inductance 30 is not reflected from the primary to the secondary circuit. In this way, the DC return path for diode 38 is through inductances 32 and 34, the DC return path for diode 52 is through inductance 34, the DC return path for diode 58a is through inductances 44a, 32, and 34, and the DC return path for diode 58b is through inductances 44b, and 62. As an additional matter, for the bandswitched higher frequency mode, the AC reference point of the balanced secondary signal shifts to a virtual node within inductance 32.

I claim:

1. An RF signal receiver comprising:

means for receiving an RF signal at a signal input terminal with respect to a signal reference potential and a DC reference potential;

a primary tank circuit comprising a first capacitor coupled in parallel with a first series circuit of a first and a second primary inductances for resonating at a first frequency, the primary tank circuit being coupled for receiving the RF signal in an unbalanced configuration;

a secondary tank circuit inductively coupled to the primary tank circuit and comprising a second capacitor coupled in parallel with a second series circuit of a first and second secondary inductances for resonating at a second frequency, the DC reference potential being coupled to a junction of the first and second secondary inductances so that the first and second secondary inductances operate together to provide a balanced output signal at a pair of balanced signal output terminals of the secondary tank circuit.

2. The RF signal receiver of claim 1 further comprising:

first and second constant bandwidth means coupled to respective ones of the balanced signal output terminals for coupling the balanced signal to respective input terminals of a balanced load.

3. An RF signal receiver comprising:

means for receiving an RF signal at a signal input terminal with respect to a signal reference potential and a DC reference potential;

a primary tank circuit comprising a first capacitor coupled in parallel with a first series circuit of a first and a second primary inductances for resonating at a first frequency, the primary tank circuit being coupled for receiving the RF signal in an unbalanced configuration;

a secondary tank circuit inductively coupled to the primary tank circuit and comprising a second capacitor coupled in parallel with a second series circuit of a first and second secondary inductances for resonating at a second frequency, the DC reference potential being coupled to a junction of the first and second secondary inductances so that the first and second secondary inductances operate together to provide a balanced output signal at a pair of balanced signal output terminals of the secondary tank circuit, and first and second constant bandwidth means coupled to respective ones of the balanced signal output terminals for coupling the balanced signal to respective input terminals of a balanced load.

4. An RF signal receiving device comprising:

means for receiving an RF signal at a signal input terminal with respect to a signal reference potential and a DC reference potential;

a primary tunable tank circuit having a first inductance and tuned to a first frequency by a first capacitor coupled in parallel with the first inductance, the primary tank circuit being coupled for receiving the RF signal in an unbalanced configuration, and a secondary tank circuit having a plurality of second inductances inductively coupled to the first inductance and having a second capacitor coupled in parallel with the second inductances for tuning the secondary to a second frequency, the plurality of second inductances having a node therebetween with the DC reference potential coupled to the node and providing a balanced output signal at the secondary tank circuit.

* * * * *